US007741726B2

(12) United States Patent
Jeon et al.

(10) Patent No.: US 7,741,726 B2

(45) Date of Patent: Jun. 22, 2010

(54) INTEGRATED CIRCUIT UNDERFILL PACKAGE SYSTEM

(75) Inventors: Hyung Jun Jeon, Seoul (KR); Ki Youn Jang, Ichon-si (KR); Dae-Wook Yang, Pyoungtaek-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/336,141

(22) Filed: Dec. 16, 2008

(65) Prior Publication Data

US 2009/0096112 A1 Apr. 16, 2009

Related U.S. Application Data

(62) Division of application No. 11/307,315, filed on Jan. 31, 2006, now Pat. No. 7,485,502.

(51) Int. Cl.
*H01L 23/29* (2006.01)
*H01L 23/02* (2006.01)

(52) U.S. Cl. ....................... 257/790; 257/787; 257/696; 257/E23.133

(58) Field of Classification Search ................. 257/787, 257/778, E23.133, 686, 784
See application file for complete search history.

(56) References Cited

U.S. PATENT DOCUMENTS 4,143,456 A 3/1979 Inoue
5,203,076 A * 4/1993 Banerji et al. ................. 29/840
5,697,148 A * 12/1997 Lance et al. .................. 29/840
5,710,071 A 1/1998 Beddingfield et al.
5,737,191 A * 4/1998 Horiuchi et al. ............. 361/764
5,892,289 A * 4/1999 Tokuno ...................... 257/783
5,981,312 A 11/1999 Farquhar et al.
6,048,656 A 4/2000 Akram et al.
6,057,178 A * 5/2000 Galuschki et al. ........... 438/126
6,157,080 A * 12/2000 Tamaki et al. ............... 257/738
6,369,449 B2 4/2002 Farquhar et al.
6,429,372 B1 * 8/2002 Taguchi et al. .............. 174/535
6,528,722 B2 * 3/2003 Huang et al. ................ 174/528
6,653,171 B2 11/2003 Ikegami
6,815,817 B2 11/2004 Akram et al.
6,975,035 B2 12/2005 Lee
7,554,197 B2 * 6/2009 Huang et al. ................ 257/737
2006/0267171 A1 * 11/2006 Lee ........................... 257/678

* cited by examiner

*Primary Examiner*—Nitin Parekh
(74) *Attorney, Agent, or Firm*—Mikio Ishimaru

(57) ABSTRACT

An integrated circuit underfill package system including providing a substrate having a dispense port, attaching a first integrated circuit die on the substrate, and supplying an underfill to the dispense port when the substrate and the first integrated circuit die are inverted.

9 Claims, 3 Drawing Sheets

100 116 112 126 124 122 106 102 108 104 110 118 114 120

INTEGRATED CIRCUIT UNDERFILL PACKAGE SYSTEM

CROSS-REFERENCE TO RELATED APPLICATION(S)

This application is a Divisional of co-pending U.S. application Ser. No. 11/307,315 filed Jan. 31, 2006, and the subject matter thereof is hereby incorporated herein by reference thereto.

TECHNICAL FIELD

The present invention relates generally to integrated circuit package systems, and more particularly to a system for an integrated circuit underfill package system.

BACKGROUND ART

Integrated circuits are used in many portable electronic products, such as cell phones, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Drawbacks of conventional designs include a relatively large footprint of the package on the mounting surface of motherboard. The footprint reflects what is typically the maximum dimension of the package, namely, the x-y dimension of the package. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnects and large footprint top packages have plagued previous stacked package or package on package designs.

Thus a need still remains for an integrated circuit package system to provide reduced area and volume. In view of the increasing demand for density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit underfill package system providing a substrate having a dispense port, attaching a first integrated circuit die on the substrate, and supplying an underfill to the dispense port when the substrate and the first integrated circuit die are inverted.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
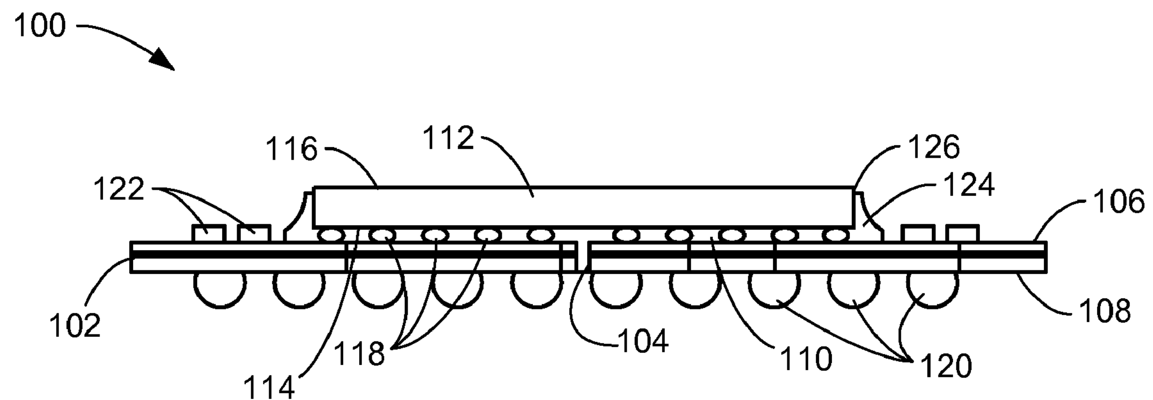
FIG. 1 is a cross-sectional view of an integrated circuit underfill package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGS. Generally, the device can be operated in any orientation. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term on means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit underfill package system 100 in an embodiment of the present invention. The integrated circuit underfill package system 100 includes a substrate 102 having a dispense port 104, a mounting surface 106 and an interconnect surface 108. An underfill 110 substantially conforms to a first integrated circuit die 112, such as a flipchip, having a first active surface 114 and a first non-active surface 116. The first active surface 114 of the first integrated circuit die 112 includes first electrical connectors 118, such as solder bumps. The first electrical connectors 118 also provide a spacing for the underfill 110.

The interconnect surface 108 of the substrate 102 may include electrical interconnects 120, such as solder balls, for interconnection to the next level system, such as a printed circuit board. The mounting surface 106 of the substrate 102 provides first electrical connections (not shown) for the first integrated circuit die 112 and second electrical connections 122 for a second integrated circuit die (not shown).

The first non-active surface 116 of the first integrated circuit die 112 may provide a surface to apply an attachment layer (not shown), such as an adhesive, an adhesive film or a spacer, for the second integrated circuit die. The first active surface 114 of the first integrated circuit die 112 is mounted to the mounting surface 106 of the substrate 102. The underfill 110 substantially conforms to the first active surface 114 of the first integrated circuit die 112 and the mounting surface 106 of the substrate 102. Further, the underfill 110 substantially conforms to a region of the mounting surface 106 of the substrate 102 similar in planar extent to the planar extent of the first integrated circuit die 112.

It has been discovered that the present invention provides previously unachievable tight control over lateral spread or bleed of an overflow 124 of the underfill 110. The underfill 110 covers portions of a side of the first integrated circuit die and leaves a surface of the first integrated circuit die uncovered. Prior to and during the curing process, the underfill 110 continues to spread. The inverted position of the present invention during the processes of underfilling and curing provides a region of a sidewall 126 of the first integrated circuit die 112 for vertically spreading the overflow 124 of the underfill 110. The sidewall 126 of the first integrated circuit die 112 constrains the lateral spread such that the overflow 124 of the underfill 110 minimally overlaps the substrate 102. The second electrical connections 122 are substantially exposed providing connection surfaces for the second integrated circuit die (not shown).

Figure 2:
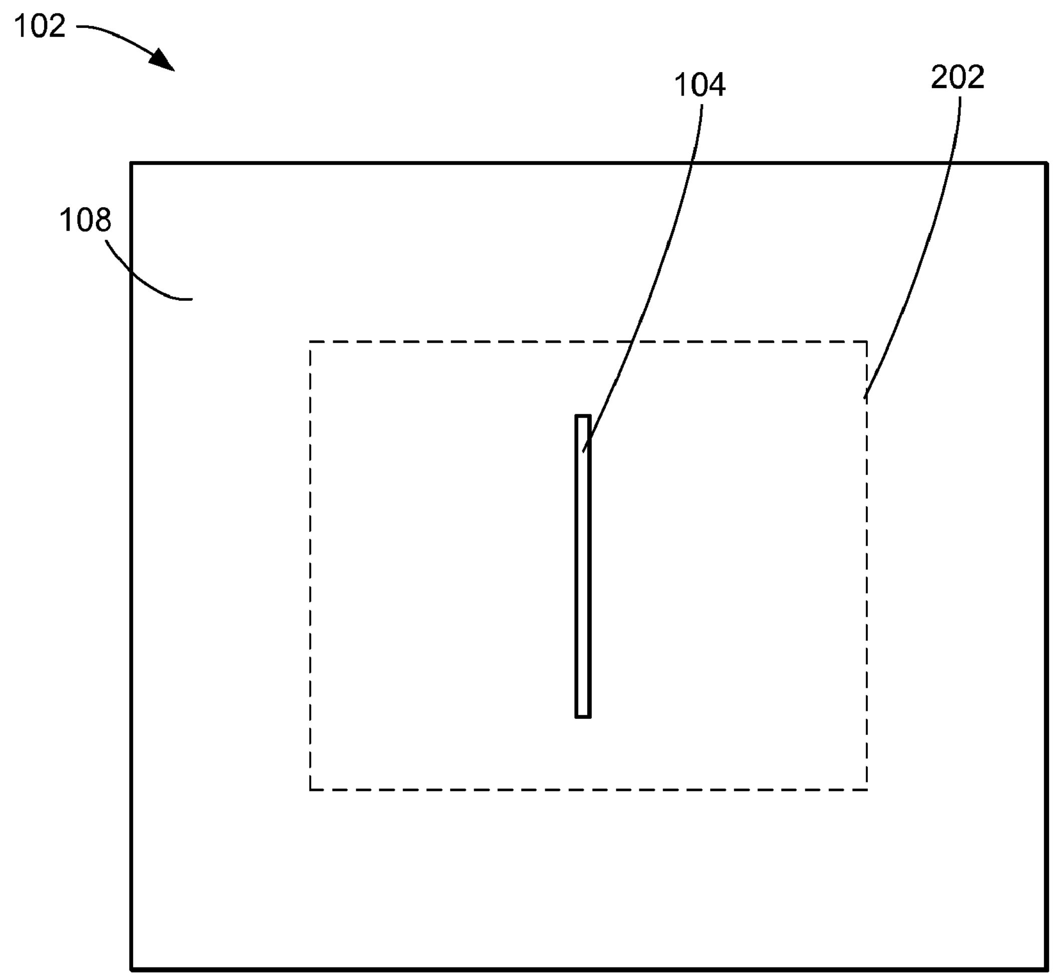
FIG. 2 is a plan view of the interconnect surface of the substrate of the integrated circuit underfill package system.

Referring now to FIG. 2, therein is shown a plan view of the interconnect surface 108 of the substrate 102 of the integrated circuit underfill package system 100. The dispense port 104 provides application of the underfill 110 of FIG. 1 from the bottom of the substrate 102 to the mounting surface 106 of the substrate 102. The underfill 110 conforms to the mounting surface 106 of FIG. 1 of the substrate 102 and the first active surface 114 of FIG. 1 of the first integrated circuit die 112 of FIG. 1 depicted by a hidden outline 202. For illustrative purposes, the dispense port 104 is shown as formed in the shape of a slot, although it is understood that it may formed in other shapes, as well. Further for illustrative purposes, the substrate 102 is shown as formed in the shape of a square, although it is understood that it may be formed in other shapes, as well.

Figure 3:
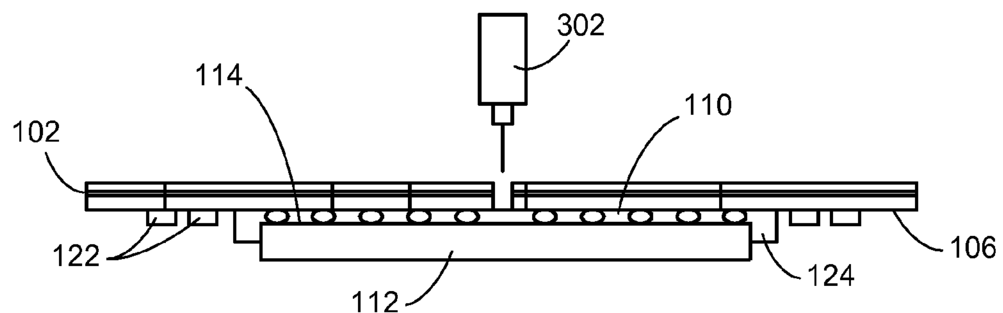
FIG. 3 is a cross-sectional view of the integrated circuit underfill package system in a dispensing phase.

Referring now to FIG. 3, therein is shown a cross-sectional view of the integrated circuit underfill package system 100 in a dispensing phase. The substrate 102 is positioned above the first integrated circuit die 112, wherein the mounting surface 106 of the substrate 102 is positioned substantially downward and the first active surface 114 of the first integrated circuit die 112 is positioned substantially upward.

The underfill 110 is applied through a dispense tool 302, such as a capillary, a pressurized tool, or a transfer tool. As the underfill 110 substantially fills a region between the mounting surface 106 of the substrate 102 and the first active surface 114 of the first integrated circuit die 112, the overflow 124 of the underfill 110 flows beyond the planar extents of the first integrated circuit die 112. The quantity of the underfill 110 is controlled by volume control or monitoring to minimize the overflow 124 of the underfill 110 to a predetermined spacing between the overflow 124 and the second electrical connections 122.

Figure 4:
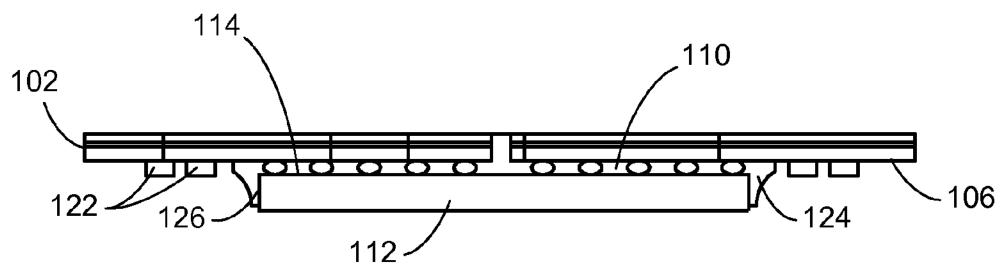
FIG. 4 is a cross-sectional view of the integrated circuit underfill package system in a curing phase.

Referring now to FIG. 4, therein is shown a cross-sectional view of the integrated circuit underfill package system 100 in a curing phase. The underfill 110 is cured with the substrate 102 positioned above the first integrated circuit die 112 in a manner similar to that of FIG. 3, wherein the mounting surface 106 of the substrate 102 is positioned substantially downward and the first active surface 114 of the first integrated circuit die 112 is positioned substantially upward. The overflow 124 of the underfill 110 continues to spread in a downward direction only on the sidewall 126 of the first integrated circuit die 112. Curing substantially fixes the overflow 124 only on the sidewall 126 of the first integrated circuit die 112 and in a lateral position to a predetermined spacing between the overflow 124 and the second electrical connections 122.

The second electrical connections 122 are substantially exposed providing connection surfaces for the second integrated circuit die (not shown). The first non-active surface 116 of the first integrated circuit die 112 may provide a surface to apply an attachment layer, such as an adhesive, an adhesive film or a spacer, for the second integrated circuit die. The integrated circuit underfill package system 100 provides protection and structural integrity to the first integrated circuit die 112 as well as space and area efficient connection for a second integrated circuit die over the first integrated circuit die 112.

Figure 5:
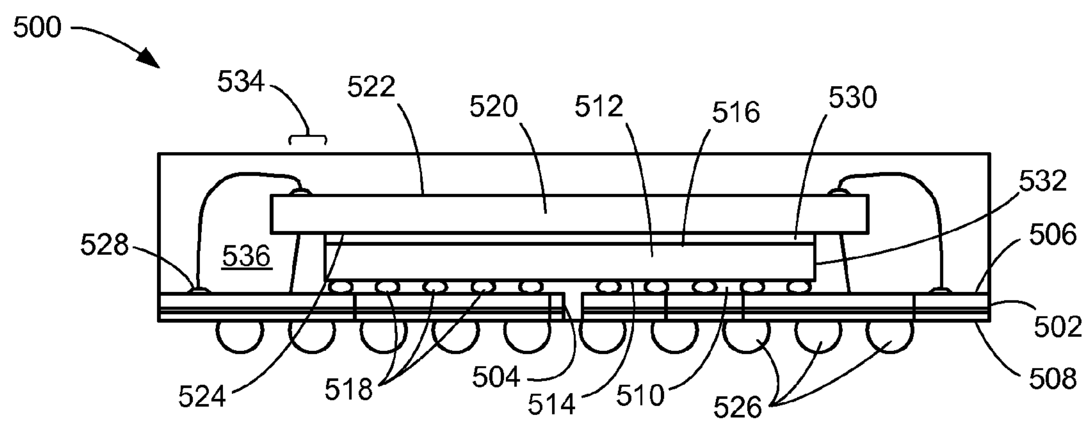
FIG. 5 is a cross-sectional view of an integrated circuit underfill package system in an alternative embodiment of the present invention.

Referring now to FIG. 5, therein is shown a cross-sectional view of an integrated circuit underfill package system 500 in an alternative embodiment of the present invention. The integrated circuit underfill package system 500 includes a substrate 502 having a dispense port 504, a mounting surface 506 and an interconnect surface 508. An underfill 510 substantially conforms to a first integrated circuit die 512, such as a flipchip, having a first active surface 514 and a first non-active surface 516. The first active surface 514 of the first integrated circuit die 512 includes first electrical connectors 518, such as solder bumps. The first electrical connectors 518 also provide a spacing for and are encapsulated by the underfill 510. The underfill 510 also provides structural integrity, such as with sustaining pillars, between the substrate 502 and a second integrated circuit die 520 having a second active surface 522 and a second non-active surface 524.

The interconnect surface 508 of the substrate 502 may include electrical interconnects 526, such as solder balls, for interconnection to the next level system, such as a printed circuit board. The mounting surface 506 of the substrate 502 provides first electrical connections (not shown) for the first integrated circuit die 512 and second electrical connections 528 for connecting the second integrated circuit die 520.

The first non-active surface 516 of the first integrated circuit die 512 may provide a surface to apply an attachment layer 530, such as an adhesive, an adhesive film or a spacer, for the second non-active surface 524 of the second integrated circuit die 520. The first active surface 514 of the first integrated circuit die 512 is mounted to the mounting surface 506 of the substrate 502. The second non-active surface 524 of the second integrated circuit die 520 is mounted over the first non-active surface 516 of the first integrated circuit die 512.

The underfill 510 substantially conforms to the first active surface 514 of the first integrated circuit die 512, a sidewall 532 of the first integrated circuit die 512, the mounting surface 506 of the substrate 502 and an overhang 534 of the second non-active surface 524 of the second integrated circuit die 520. Further the underfill 510 substantially conforms to a region of the mounting surface 506 of the substrate 502 similar in planar extents to planar extents of the first integrated circuit die 512 and the second integrated circuit die 520.

An encapsulant 536 encapsulates the second integrated circuit die 520 and the underfill 510 above the substrate 502.

Figure 6:
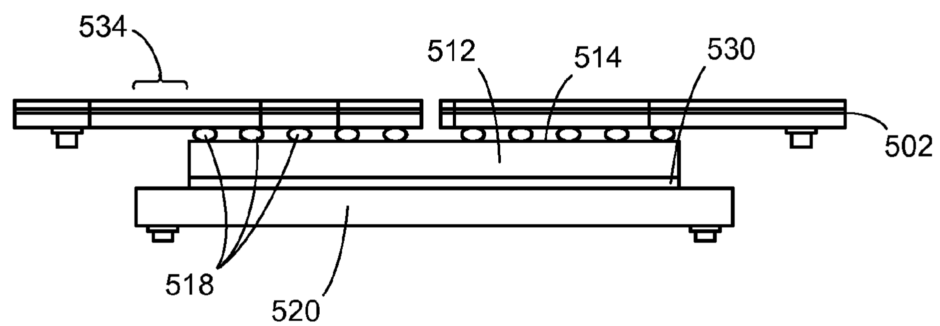
FIG. 6 is a cross-sectional view of the integrated circuit underfill package system in a die attaching phase.

Referring now to FIG. 6, therein is shown a cross-sectional view of the integrated circuit underfill package system 500 in a die attaching phase. The first electrical connectors 518 of the first active surface 514 of the first integrated circuit die 512 are attached to the mounting surface 506 of the substrate 502. The first electrical connectors 518 provide electrical and mechanical connectivity between the first integrated circuit die 512 and the substrate 502. The attachment layer 530 is applied between the first non-active surface 516 of the first integrated circuit die 512 and the second non-active surface 524 of the second integrated circuit die 520. The attachment layer 530 provides connectivity, such as mechanical, thermal or electrical, between the first integrated circuit die 512 and the second integrated circuit die 520.

Figure 7:
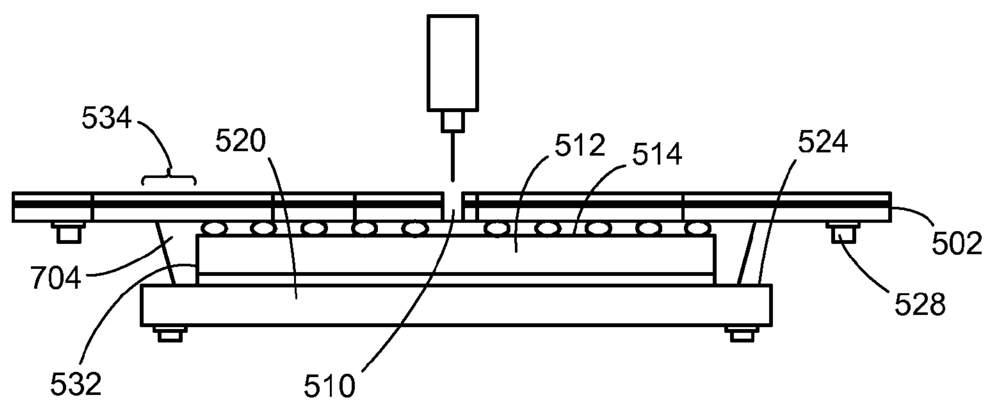
FIG. 7 is a cross-sectional view of the integrated circuit underfill package system in a dispensing phase.

Referring now to FIG. 7, therein is shown a cross-sectional view of the integrated circuit underfill package system 500 in a dispensing phase. The substrate 502 is positioned above the first integrated circuit die 512, wherein the mounting surface 506 of the substrate 502 is positioned substantially downward and the first active surface 514 of the first integrated circuit die 512 is positioned substantially upward.

The underfill 510 is applied through a dispense tool 702, such as a capillary, a pressurized tool, or a transfer tool. The underfill 510 substantially fills a region between the mounting surface 506 of the substrate 502, the first active surface 514 of the first integrated circuit die 512 and the overhang 534 of the second non-active surface 524 of the second integrated circuit die 520. The underfill 510 flows beyond the planar extents of the first integrated circuit die 512 forming an overflow 704.

A quantity of the underfill 510 is controlled, such as monitored or predetermined, to minimize the overflow 704 of the underfill 510 to a predetermined spacing between the overflow 704 and the second electrical connections 528. The quantity of the underfill 510 may also be controlled to provide predetermined dimensions of the overflow 704 for structural integrity between the substrate 502 and the second integrated circuit 520.

The overflow 704 of the underfill 510 continues to spread in a downward direction on the sidewall 532 of the first integrated circuit die 512. The overflow 704 is substantially fixed on the sidewall 532 of the first integrated circuit die 512 and in a lateral position to a predetermined spacing between the overflow 704 and the second electrical connections 528.

Figure 8:
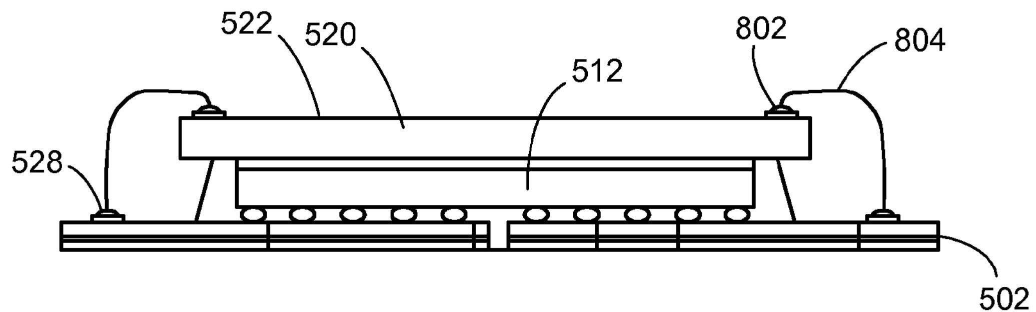
FIG. 8 is a cross-sectional view of the integrated circuit underfill package system in an electrical connecting phase.

Referring now to FIG. 8, therein is shown a cross-sectional view of the integrated circuit underfill package system 500 in an electrical connecting phase. The second active surface 522 of the second integrated circuit die 520 includes second electrical connectors 802. The second electrical connectors 802 of the second active surface 522 of the second integrated circuit die 520 are electrically connected to the second electrical connections 528 of the substrate 502. Conductive connectors 804, such as bond wires, electrically connect the second integrated circuit die 520 to the substrate 502 and may provide electrical connectivity to the first integrated circuit die 512.

Figure 9:
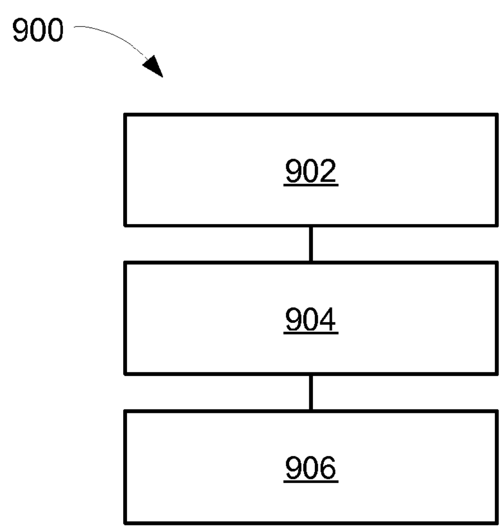
FIG. 9 is a flow chart of a system for the integrated circuit underfill package system in an embodiment of the present invention.

Referring now to FIG. 9, therein is shown a flow chart of a system 900 for the integrated circuit underfill package system 100 in an embodiment of the present invention. The system 900 includes providing a substrate having a dispense port in a block 902; attaching a first integrated circuit die on the substrate in a block 904; and supplying an underfill to the dispense port when the substrate and the first integrated circuit die are inverted in a block 906.

In greater detail, a method to fabricate the integrated circuit underfill package system 100, in an embodiment of the present invention, is performed as follows:

1. Forming the substrate 102 having the dispense port 104, the first electrical connections (not shown) and the second electrical connections 122. (FIG. 1)
2. Mounting the first integrated circuit die 112 having the first electrical connectors 118 on the substrate 102. (FIG. 1)
3. Dispensing the underfill 110 in the dispense port 104 between the substrate 102 and the first integrated circuit die 112, when the substrate 102 and the first integrated circuit die 112 are inverted. (FIG. 1)
4. Curing the overflow 124 and the underfill 110 between the substrate 102 and the first integrated circuit die 112, when the substrate 102 and the first integrated circuit die 112 are inverted. (FIG. 1)

It has been discovered that the present invention thus has numerous aspects.

An aspect is that the present invention allows the package to be of a smaller size and volume. A smaller substrate provides the smaller size and volume. The low height of the integrated circuit mounting provides additional reductions in volume. Enabling the smaller size or footprint also provides improved signal integrity as well as the significant area and space savings.

It has been discovered that the present invention provides previously unachievable tight control over lateral spread or bleed of an overflow of the underfill. The control of the underfill allows for a smaller substrate area as well as a lower mounting height. These improve stacking and integrated circuit performance as well.

It has also been discovered that the disclosed structure provides for a variety of integrated circuit sizes within the same package. Various actual sizes as well as relative sizes of the stacked integrated circuits can be interconnected efficiently utilizing the multiple embodiments. The variety of sizes provides improved functionality and performance for stacked integrated circuit package.

Yet another discovery of the disclosed structure is that the disclosed structure provides a minimized dispense area for the underfill. The minimized area simplifies the manufacturing processes and equipment. These results in increased manufacturing efficiency, higher system performance, and lower product costs.

Yet another discovery of the disclosed structure is that the disclosed structure provides improved underfill integrity, such as a reduction in underfill voids. The reduction in underfill voids improves thermal dissipation, structural rigidity and mounting height. Increased manufacturing efficiency, higher system performance and lower products cost are again benefited.

These and other valuable aspects of the present invention consequently further the state of the technology to at least the next level.

Thus, it has been discovered that the integrated circuit underfill package system method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. An integrated circuit underfill package system comprising:

a substrate having a dispense port;

a first integrated circuit die on the substrate;

an underfill to the dispense port and between the substrate and the first integrated circuit die, the underfill covers portions of a side of the first integrated circuit die and leaves a surface of the first integrated circuit die uncovered; and a second integrated circuit die over the first integrated circuit die, and the underfill does not fill a space directly under the second integrated circuit die and the first integrated circuit die.

2. The system as claimed in claim 1 further comprising:

the second integrated circuit die over the first integrated circuit die; and the underfill fills a space between the second integrated circuit die and the substrate.

3. The system as claimed in claim 1 wherein the underfill comprises an overflow of the underfill on a sidewall of the first integrated circuit die.

4. The system as claimed in claim 1 wherein the substrate has electrical connections encapsulated by the underfill

5. The system as claimed in claim 1 wherein:

the substrate has first electrical connections and second electrical connections;

the first integrated circuit die has first electrical connectors connected to the first electrical connections positioned around the dispense port; and the underfill is cured between the substrate and the first integrated circuit die.

6. The system as claimed in claim 5 wherein the substrate comprises:

a mounting surface with the first electrical connections and the second electrical connections; and an interconnect surface for electrical interconnects.

7. The system as claimed in claim 5 wherein:

the first integrated circuit die comprises a flipchip having solder bumps attached to the first electrical connections.

8. The system as claimed in claim 5 wherein:

the underfill fills a predetermined space between the overflow and second electrical connections and is on a sidewall of the first integrated circuit die.

9. The system as claimed in claim 5 wherein:

the underfill is cured between the first integrated circuit die and the second electrical connections and on a sidewall of the first integrated circuit die.

* * * * *